US012580363B2

(12) United States Patent (10) Patent No.: US 12,580,363 B2

Maeda et al. (45) Date of Patent: Mar. 17, 2026

(54) OPTICAL SEMICONDUCTOR ELEMENT

(71) Applicant: Mitsubishi Electric Corporation, Tokyo (JP)

(72) Inventors: Kazuhiro Maeda, Tokyo (JP); Hitoshi Sakuma, Tokyo (JP); Hitoshi Tada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 698 days.

(21) Appl. No.: 17/790,794

(22) PCT Filed: Mar. 19, 2020

(86) PCT No.: PCT/JP2020/012412

§ 371 (c)(1),
(2) Date: Jul. 5, 2022

(87) PCT Pub. No.: WO2021/186695

PCT Pub. Date: Sep. 23, 2021

(65) Prior Publication Data

US 2023/0042492 A1 Feb. 9, 2023

(51) Int. Cl.
*H01S 5/026* (2006.01)
*H01S 5/0234* (2021.01)
(Continued)

(52) U.S. Cl.
CPC .......... *H01S 5/0234* (2021.01); *H01S 5/0265* (2013.01); *H01S 5/04256* (2019.08);
(Continued)

(58) Field of Classification Search
CPC .......... H01S 5/24; H01S 5/2202; H01S 5/026; H01S 5/0234; H01S 5/22–2277; H01S 5/0265
See application file for complete search history.

(56) References Cited

U.S. PATENT DOCUMENTS 5,678,935 A * 10/1997 Sakata ...................... H01S 5/12
257/14
6,134,368 A * 10/2000 Sakata .................... H01S 5/227
372/50.1
(Continued)

FOREIGN PATENT DOCUMENTS

CN 106684706 A * 5/2017 ........... H01S 5/0207
EP 4210184 A1 * 7/2023 ........... H01S 5/0265
(Continued)

OTHER PUBLICATIONS

International Search Report issued in PCT/JP2020/012412; mailed Jun. 23, 2020.
(Continued)

*Primary Examiner* — Tod T Van Roy

(74) *Attorney, Agent, or Firm* — Studebaker Brackett PLLC

(57) ABSTRACT

This optical semiconductor element includes: a substrate; a first ridge formed on the substrate and having a first first-conductivity-type cladding layer, a first core layer, a first second-conductivity-type cladding layer, and a first contact layer in this order from a lower side, with first ridge grooves provided on both lateral sides of the first ridge; and a first electrode formed in contact with the first contact layer, on the first ridge, without spreading to the first ridge grooves, the first electrode including a first solder layer.

15 Claims, 13 Drawing Sheets

(51) Int. Cl.
  *H01S 5/042*     (2006.01)
  *H01S 5/22*      (2006.01)
  *H01S 5/0237*    (2021.01)
(52) U.S. Cl.
  CPC ........ *H01S 5/04257* (2019.08); *H01S 5/0427* (2013.01); *H01S 5/2202* (2013.01); *H01S 5/0237* (2021.01); *H01S 5/2213* (2013.01)

(56)             References Cited

U.S. PATENT DOCUMENTS

|  |  |  |  |  |
|---|---|---|---|---|
| 6,226,310 B1 * | 5/2001 | Takagi | .................. | H01S 5/0265 |
|  |  |  |  | 372/50.11 |
| 6,236,771 B1 * | 5/2001 | Aoki | .................. | H01S 5/02375 |
|  |  |  |  | 385/2 |
| 6,542,525 B1 * | 4/2003 | Matsumoto | ........... | H01S 5/0265 |
|  |  |  |  | 372/50.1 |
| 6,995,454 B2 * | 2/2006 | Murata | ................. | H01S 5/0265 |
|  |  |  |  | 257/94 |
| 7,023,891 B2 * | 4/2006 | Haneda | ................... | H01S 5/227 |
|  |  |  |  | 372/45.01 |
| 7,733,934 B2 * | 6/2010 | Yamatoya | ................. | H01S 5/22 |
|  |  |  |  | 372/45.01 |
| 10,156,741 B2 * | 12/2018 | Lee | ..................... | G02F 1/01716 |
| 10,554,019 B2 * | 2/2020 | Singer | ................... | H01S 5/0201 |
| 10,886,704 B2 * | 1/2021 | Singer | .................... | H01L 24/19 |
| 11,378,762 B2 * | 7/2022 | Yu | ........................... | G02B 6/136 |
| 12,100,929 B2 * | 9/2024 | Nakajima | ............. | H01S 5/0282 |
| 12,119,611 B2 * | 10/2024 | Ono | ........................ | H01S 5/022 |
| 2002/0172245 A1 * | 11/2002 | Nakatsuka | ........... | H01S 5/4031 |
|  |  |  |  | 372/50.12 |
| 2002/0195622 A1 * | 12/2002 | Ishimura | ............. | G02F 1/01708 |
|  |  |  |  | 257/200 |
| 2004/0238828 A1 * | 12/2004 | Ito | ........................ | H01S 5/0265 |
|  |  |  |  | 257/94 |
| 2008/0219315 A1 * | 9/2008 | Makino | ..................... | H01S 5/12 |
|  |  |  |  | 372/50.1 |
| 2008/0291960 A1 * | 11/2008 | Inoue | .................. | H01S 5/02375 |
|  |  |  |  | 372/45.01 |
| 2009/0285254 A1 | 11/2009 | Takayama et al. |  |  |
| 2013/0058371 A1 * | 3/2013 | Yoneda | .................. | B82Y 20/00 |
|  |  |  |  | 372/50.11 |
| 2013/0343417 A1 * | 12/2013 | Takagi | .................. | H01S 5/0265 |
|  |  |  |  | 372/50.12 |
| 2018/0041008 A1 * | 2/2018 | Takagi | .................. | H01S 5/0265 |
| 2018/0067341 A1 * | 3/2018 | Kanazawa | ........... | H01S 5/0265 |
| 2018/0287333 A1 * | 10/2018 | Ooi | ........................ | H01S 5/0265 |
| 2018/0301873 A1 * | 10/2018 | Singer | ..................... | H01S 5/227 |
| 2019/0379179 A1 * | 12/2019 | Kan | .......................... | H01S 5/22 |
| 2020/0153197 A1 * | 5/2020 | Chen | .................. | H01S 5/04257 |
| 2021/0050706 A1 * | 2/2021 | Kusunoki | ............ | H01S 5/0237 |
| 2023/0042492 A1 * | 2/2023 | Maeda | ............... | H01S 5/04257 |
| 2023/0117332 A1 * | 4/2023 | Iwamoto | ............ | H01S 5/04254 |
|  |  |  |  | 372/43.01 |
| 2024/0201522 A1 * | 6/2024 | Kanazawa | ........... | G02F 1/0157 |

FOREIGN PATENT DOCUMENTS

| JP | H01115187 A | * | 5/1989 |
|---|---|---|---|
| JP | H05-55712 A |  | 3/1993 |
| JP | H07-135369 A |  | 5/1995 |
| JP | 2000-208859 A |  | 7/2000 |

OTHER PUBLICATIONS

An Office Action; mailed by the China National Intellectual Property Administration of the People's Republic of China on Sep. 20, 2024, which corresponds to Chinese Patent Application No. 202080098451.7 and is related to U.S. Appl. No. 17/790,794.

* cited by examiner

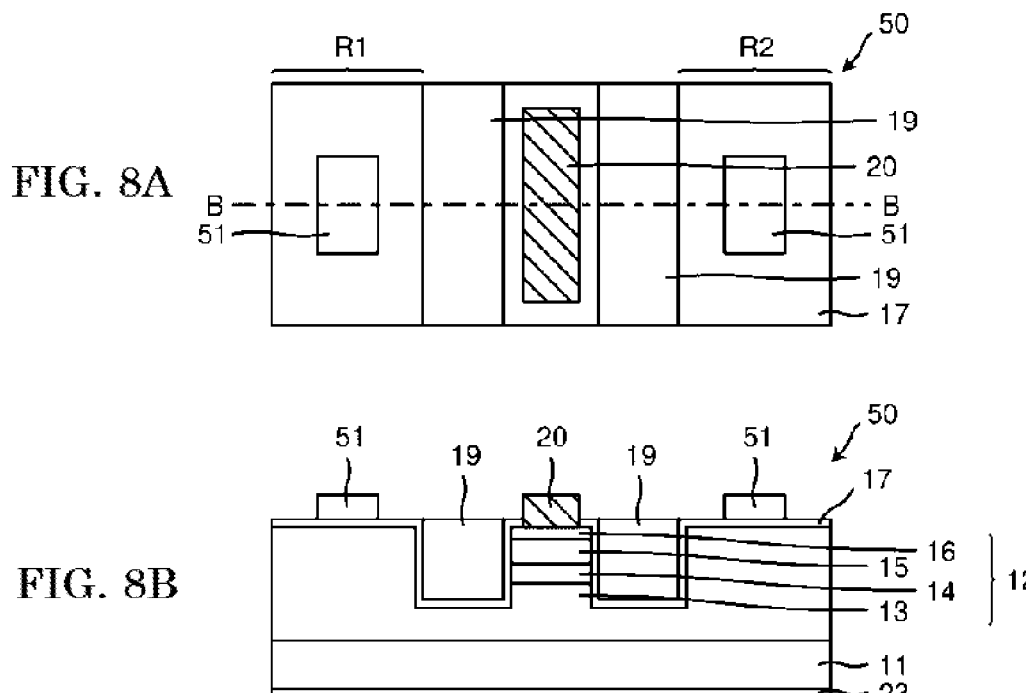
FIG. 8A
FIG. 8B
FIG. 9
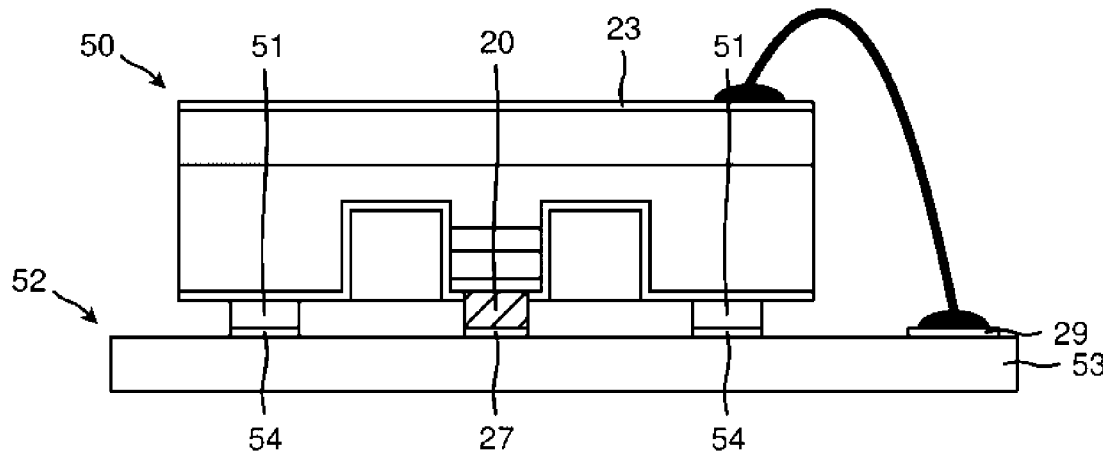

Laser Portion          Modulator Portion

FIG. 17A
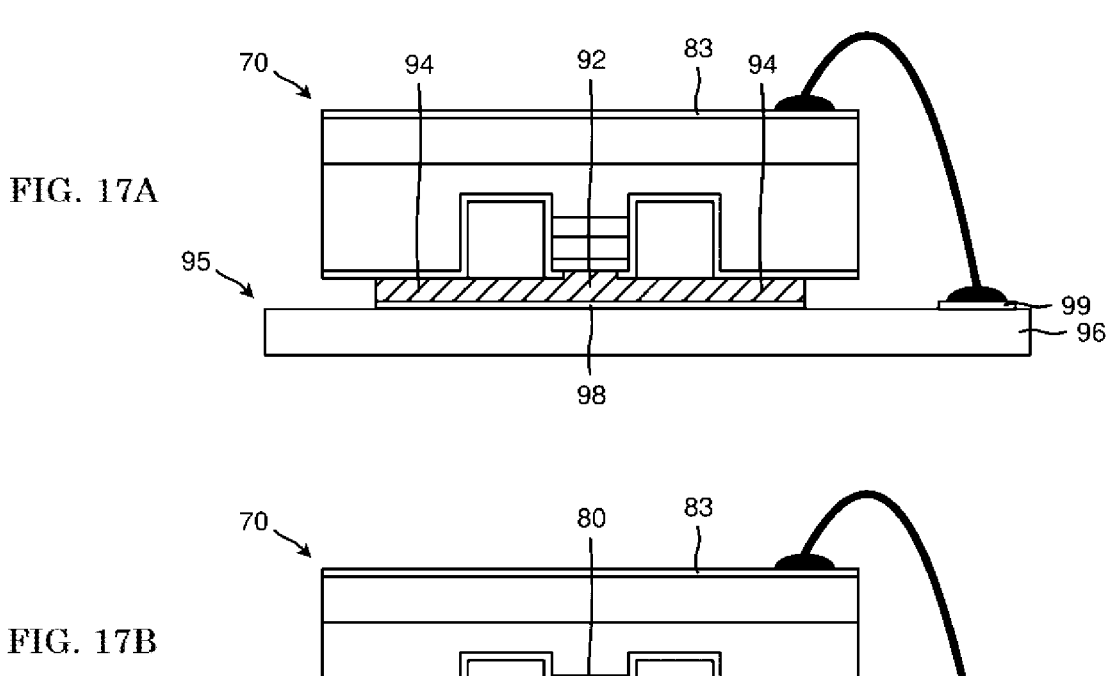
FIG. 17B
FIG. 18
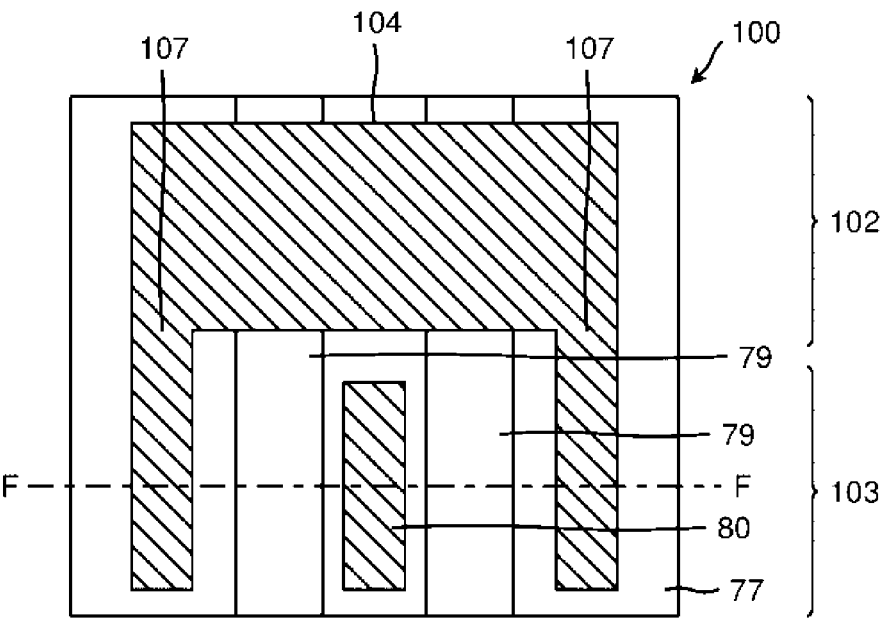

OPTICAL SEMICONDUCTOR ELEMENT

TECHNICAL FIELD

The present disclosure relates to an optical semiconductor element that is junction-down mounted.

BACKGROUND ART

Some of optical semiconductor elements such as a semiconductor laser are junction-down mounted for the purpose of high-speed operation (see, for example, Patent Document 1). In junction-down mounting, the inductance of wiring is smaller than in wire-bonding mounting, and thus operation can be performed at high speed.

CITATION LIST

Patent Document

Patent Document 1: Japanese Laid-Open Patent Publication No. 2000-208859

SUMMARY OF THE INVENTION

Problems to be Solved by the Invention

However, in the above optical semiconductor element, the areas of electrodes are large and therefore speed increase is hindered. A solder electrode for joining is formed on a sub-mount on which the above optical semiconductor element is mounted. It is difficult to form a fine solder electrode pattern on the sub-mount and thus the area of the solder electrode increases. Therefore, the electrodes of the optical semiconductor element also need to be enlarged in accordance with the solder electrode. As a result, the parasitic capacitances of the electrodes become large, so that the optical semiconductor element cannot be operated at high speed.

The present disclosure has been made to solve the above problem, and an object of the present disclosure is to provide an optical semiconductor element that enables high-speed operation.

Solution to the Problems

An optical semiconductor element according to the present disclosure includes: a substrate; a first ridge formed on the substrate and having a first first-conductivity-type cladding layer, a first core layer, a first second-conductivity-type cladding layer, and a first contact layer in this order from a lower side, with first ridge grooves provided on both lateral sides of the first ridge; a first electrode formed in contact with the first contact layer, on the first ridge, without spreading to the first ridge grooves, the first electrode including a first solder layer; a second ridge formed on the substrate and contiguous to the first ridge, the second ridge having a second first-conductivity-type cladding layer, a second core layer, a second second-conductivity-type cladding layer, and a second contact layer in this order from a lower side, with second ridge grooves provided on both lateral sides of the second ridge; and a second electrode formed in contact with the second contact layer, on the second ridge, and having a spreading portion spreading over the second ridge grooves, the second electrode including a second solder layer. The second core layer is an active layer that emits a laser beam. The first core layer is an absorption layer that modulates the laser beam from the second core layer.

Effect of the Invention

In the optical semiconductor element according to the present disclosure, since the electrode including a layer made of solder is formed on the ridge, high-speed operation can be performed.

BRIEF DESCRIPTION OF THE DRAWINGS

FIG. 8A is a top view of an optical semiconductor element according to embodiment 3.

FIG. 8B is a sectional view of the optical semiconductor element according to embodiment 3 along line B-B in FIG. 8A.

FIG. 9 is a sectional view showing an example in which the optical semiconductor element according to embodiment 3 is junction-down mounted on a sub-mount.

FIG. 17A is a sectional view at a laser portion of the optical semiconductor element according to embodiment 5.

FIG. 17B is a sectional view at a modulator portion of the optical semiconductor element according to embodiment 5.

FIG. 18 is a top view of an optical semiconductor element according to embodiment 6.

DESCRIPTION OF EMBODIMENTS

Embodiment 1

Figure 1:
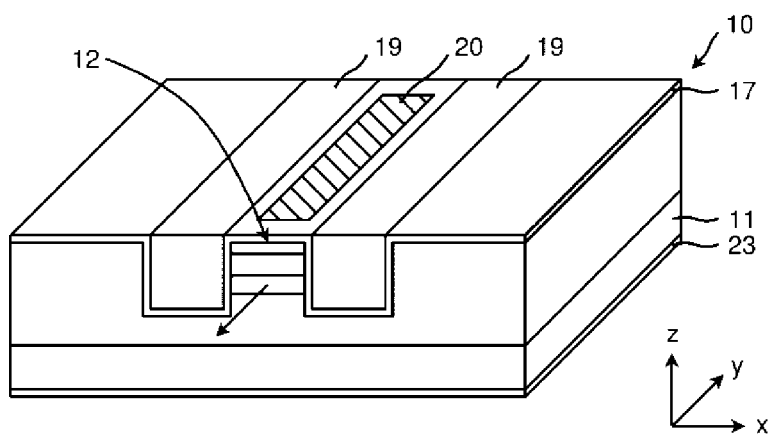
FIG. 1 is a perspective view of an optical semiconductor element according to embodiment 1.
Figure 2A:
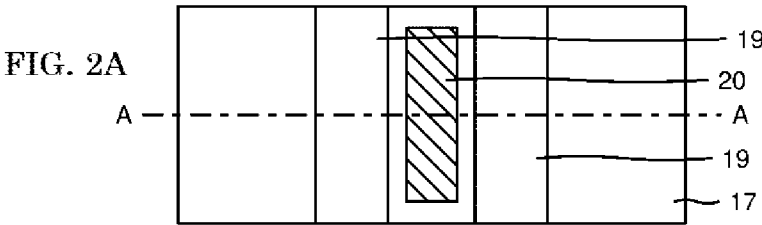
FIG. 2A is a top view of the optical semiconductor element according to embodiment 1 as seen in a plan view.
Figure 2B:
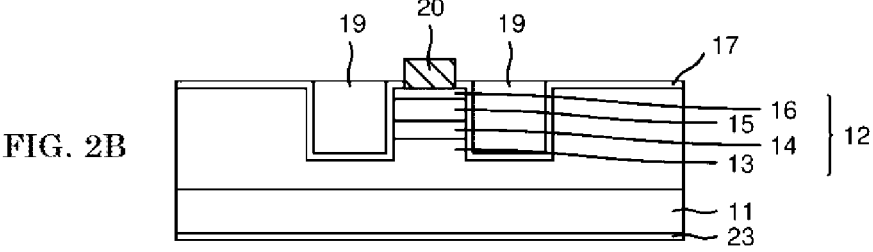
FIG. 2B is a sectional view of the optical semiconductor element according to embodiment 1 along line A-A in FIG. 2A.

The configuration of an optical semiconductor element according to embodiment 1 will be described. FIG. 1 is a perspective view of an optical semiconductor element 10 according to embodiment 1. In FIG. 1, the directions of x, y, z axes are shown. In FIG. 1, the thickness of a first electrode 20 is not shown. Also in the other subsequent perspective views, the thickness of an electrode at a top surface is not shown. FIG. 2A is a top view of the optical semiconductor element 10 as seen in a plan view. Here, the plan view means a view as seen from the upper side of z axis. FIG. 2B is a sectional view of the optical semiconductor element 10 along line A-A in FIG. 2A.

The optical semiconductor element 10 has a substrate 11. The substrate 11 is a semiconductor substrate made of InP, for example.

The optical semiconductor element 10 has a first ridge 12. The first ridge 12 is formed on the substrate 11. A stripe direction of the first ridge 12 is a direction (y-axis direction) perpendicular to the drawing sheet of FIG. 2B. The width of the first ridge 12 is, for example, 1 μm to 30 μm.

The first ridge 12 has a first first-conductivity-type cladding layer 13, a first core layer 14, a first second-conductivity-type cladding layer 15, and a first contact layer 16 in this order from the lower side. The first first-conductivity-type cladding layer 13 is a semiconductor layer whose conductivity type is a p type or an n type, and is made of InP. The first core layer 14 is an active layer having a quantum well structure and is made of InGaAsP. The first second-conductivity-type cladding layer 15 is a semiconductor layer whose conductivity type is opposite to that of the first first-conductivity-type cladding layer 13, and is made of InP. The first contact layer 16 is made of InGaAs which is conductive. The first core layer 14 emits a laser beam. The laser beam is modulated by current flowing through the first core layer 14. The laser beam is emitted from an end surface as shown by an arrow in FIG. 1.

Figures 4A, 4B, 4C, 4D, 4E:
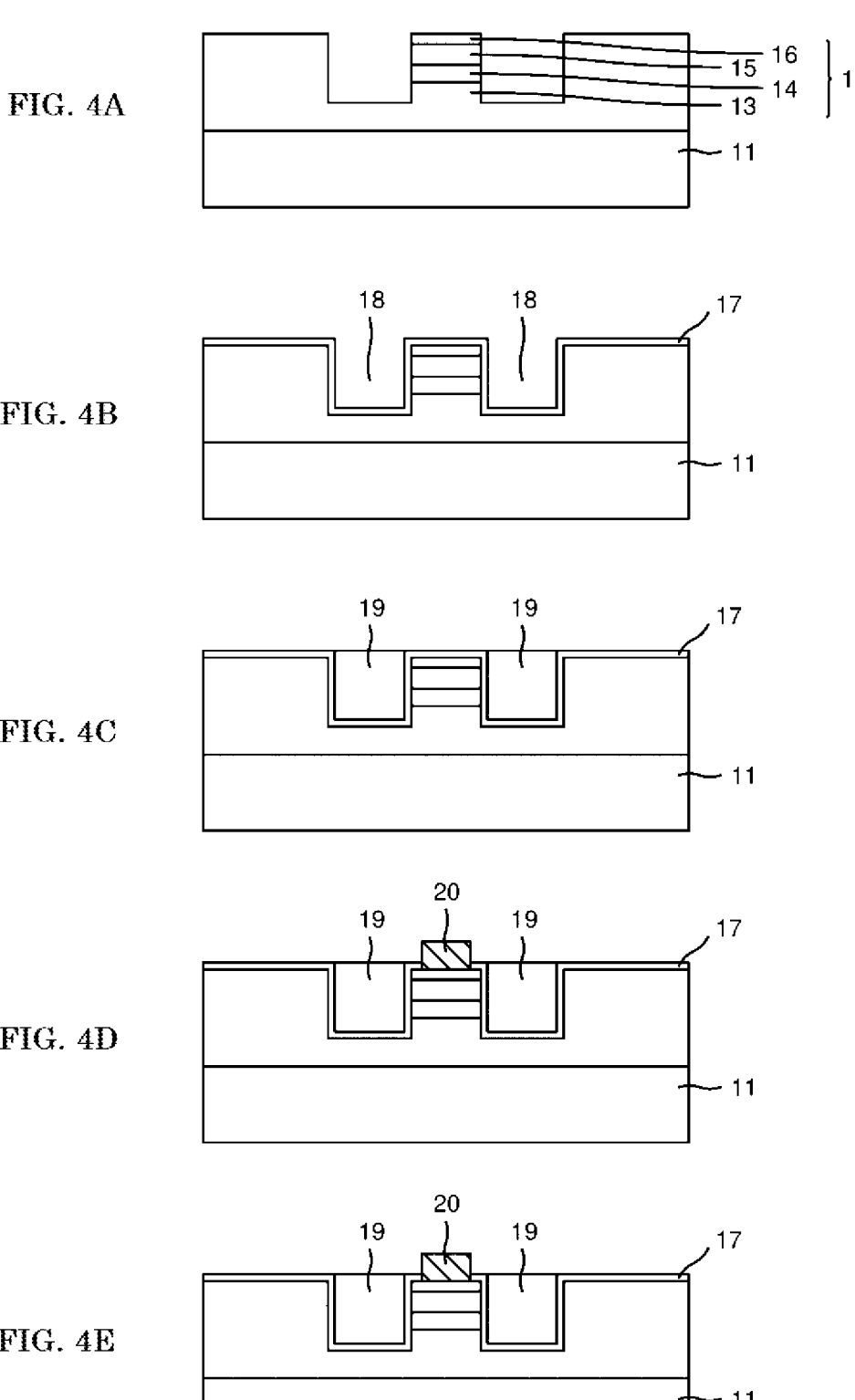
FIG. 4A is a sectional view illustrating a manufacturing method for the optical semiconductor element according to embodiment 1.
FIG. 4B is a sectional view illustrating the manufacturing method for the optical semiconductor element according to embodiment 1.
FIG. 4C is a sectional view illustrating the manufacturing method for the optical semiconductor element according to embodiment 1.
FIG. 4D is a sectional view illustrating the manufacturing method for the optical semiconductor element according to embodiment 1.
FIG. 4E is a sectional view illustrating the manufacturing method for the optical semiconductor element according to embodiment 1.

First ridge grooves 18 are provided on both lateral sides of the first ridge 12. The locations of the first ridge grooves 18 are shown in FIG. 4B which illustrates a manufacturing method. The width of each first ridge groove 18 is, for example, 2 μm to 20 μm, and the depth thereof is, for example, 2 μm to 10 μm. An insulating film 17 is formed on a surface of the first ridge 12 excluding a part of the top surface thereof, and on side surfaces and bottom surfaces of the first ridge grooves 18. A resin film 19 is embedded in each first ridge groove 18. The resin film 19 is made of benzocyclobutene (BCB), polyimide, or the like.

Figure 3:
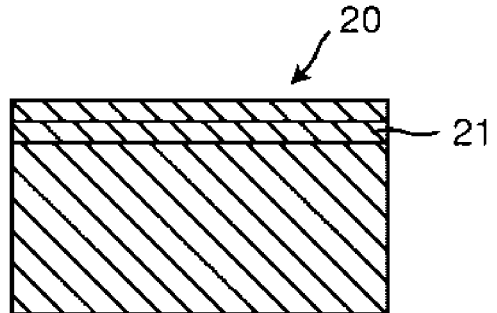
FIG. 3 is a sectional view showing a first electrode of the optical semiconductor element according to embodiment 1.

The optical semiconductor element 10 has the first electrode 20. The first electrode 20 is in contact with the first contact layer 16, on the first ridge 12. The first electrode 20 is formed on only an upper part of the first ridge 12 without spreading to the first ridge grooves 18. FIG. 3 shows an enlarged view of the first electrode 20 alone. The first electrode 20 has a layer structure such as Ti/Au/Ti/Pt/AuSn (solder)/Au or Ti/Pt/Au/Ti/Pt/AuSn (solder)/Au from the lower side. Among these layers, the Ti layer and the Pt layer are thin films having a thickness of 1 μm or less. The AuSn layer is a first solder layer 21. The film thickness of the first solder layer 21 is 1 μm to 10 μm. The topmost Au layer is a thin film having a thickness of 1 μm or less. Ti contributes to improvement in electrode adhesion, and Pt serves as barrier metal. As the barrier metal, Ni, Ta, Cr, or the like may be used instead of Pt. The topmost Au layer serves to prevent oxidation of the surface of the first electrode 20.

The optical semiconductor element 10 has a back-surface electrode 23 at a lower surface of the substrate. The back-surface electrode 23 is electrically connected to the first first-conductivity-type cladding layer 13 via the substrate 11.

The longitudinal-direction (y-axis-direction) length of the optical semiconductor element 10 is, for example, 200 μm to 400 μm.

Next, a manufacturing method for the optical semiconductor element 10 will be described with reference to sectional views (FIGS. 4A to 4E).

First, as shown in FIG. 4A, the substrate 11 on which the first ridge 12 has been formed using a known semiconductor process technology is prepared. Next, as shown in FIG. 4B, the insulating film 17 is formed. Thus, the regions of the first ridge grooves 18 are determined. Next, as shown in FIG. 4C, the resin films 19 are embedded in the first ridge grooves 18. Next, as shown in FIG. 4D, the insulating film 17 on the first ridge 12 is etched so that the first contact layer 16 is exposed, and then the first electrode 20 is formed in contact with the first contact layer 16. Next, as shown in FIG. 4E, a lower surface of the substrate 11 is ground so that the substrate 11 becomes a thin plate, and then the back-surface electrode 23 is formed.

Figure 5:
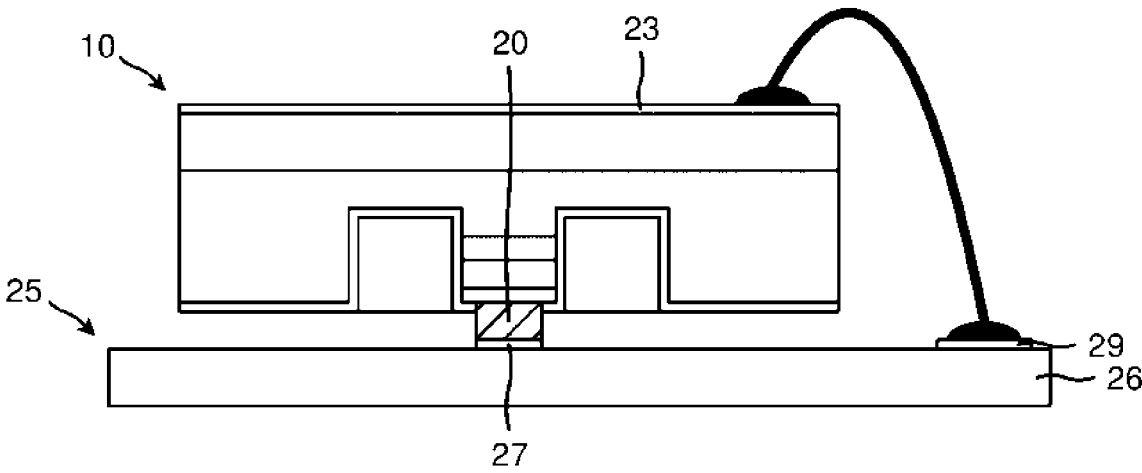
FIG. 5 is a sectional view showing an example in which the optical semiconductor element according to embodiment 1 is junction-down mounted on a sub-mount.

Next, an example in which the optical semiconductor element 10 is junction-down mounted on a sub-mount 25 will be described with reference to FIG. 5. FIG. 5 is a sectional view showing a state in which the optical semiconductor element 10 is mounted on the sub-mount 25. In FIG. 5, a bonding wire is shown, but this is for convenience sake in description and therefore the bonding wire need not be present on an xz plane.

The sub-mount 25 has a sub-mount substrate 26, and a first sub-mount electrode 27 and a wire-bonding electrode 29 are formed on the sub-mount substrate 26. The first sub-mount electrode 27 and the wire-bonding electrode 29 have a layer structure such as Ti/Au or Ti/Pt/Au from the lower side. If a solder layer is formed at the first sub-mount electrode 27, it is difficult to control the amount of solder, and therefore it is difficult to make a fine pattern of the first sub-mount electrode 27. However, in the present embodiment, a solder layer is not formed at the first sub-mount electrode 27, and therefore it is possible to make a fine pattern of the first sub-mount electrode 27.

The optical semiconductor element 10 is joined to the sub-mount 25. The joining is made by the first electrode 20 and the first sub-mount electrode 27. The first solder layer 21 of the first electrode 20 serves as a joining agent.

The back-surface electrode 23 and the wire-bonding electrode 29 are wire-bonded to each other.

As described above, according to embodiment 1, since the first electrode 20 including the first solder layer 21 is formed on the first ridge 12, the area of the first electrode 20 is small. Thus, the parasitic capacitance of the first electrode 20 becomes small, so that the optical semiconductor element 10 can be operated at high speed. In addition, since the area of the first electrode 20 is small, the amount of solder in the first solder layer 21 can be decreased, whereby spreading of the solder after junction-down mounting is suppressed. In addition, since the resin film 19 having lower permittivity than a semiconductor material is embedded in the first ridge groove 18, the parasitic capacitance of the first electrode 20 can be reduced. In addition, since the optical semiconductor element 10 is junction-down mounted on the sub-mount 25, the inductance of wiring becomes small. In addition, wire-bonding work is not needed and thus assembling can be easily performed. In addition, heat dissipation is facilitated, whereby it is possible to perform high-temperature high-output operation. In addition, since the first electrode 20 includes the first solder layer 21, solder is not needed for the first sub-mount electrode 27 of the sub-mount 25, and thus the area of the first sub-mount electrode 27 can be reduced.

In addition, a plurality of optical semiconductor elements 10 can be easily mounted on a sub-mount. If the solder layer is present not at the first electrode 20 but at the electrode on the sub-mount side, after one optical semiconductor element 10 is mounted, solder at the electrodes on the sub-mount side for joining the second and subsequent optical semiconductor elements 10 has been already melted. Therefore, it is impossible to mount a plurality of optical semiconductor elements one by one on one sub-mount. However, in the optical semiconductor element 10 of embodiment 1, the first solder layer 21 is present at the first electrode 20, and the layer made of Au is present on the first solder layer 21. Therefore, after one optical semiconductor element is mounted, AuSn of the first solder layer 21 reacts with the above Au and thus becomes AuSn having a higher Au density. The higher the Au density of AuSn is, the higher the melting point of AuSn is. Therefore, the melting point of the first solder layer 21 after the mounting has become high. Thus, at the time of mounting the second and subsequent optical semiconductor elements 10, the first solder layer 21 of the optical semiconductor element 10 that has been already mounted does not melt and the optical semiconductor elements 10 can be easily mounted successively.

Embodiment 2

An optical semiconductor element according to embodiment 2 will be described. The optical semiconductor element according to embodiment 2 is different from embodiment 1 in that the electrode on the ridge has a T shape. Here, difference from embodiment 1 will be mainly described.

Figure 6:
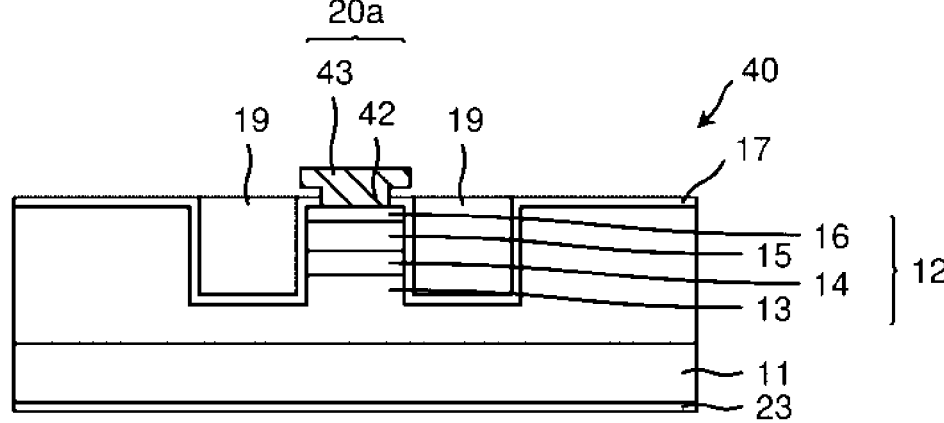
FIG. 6 is a sectional view of an optical semiconductor element according to embodiment 2.

FIG. 6 is a sectional view of an optical semiconductor element 40 according to embodiment 2. A first electrode 20a on the first ridge 12 has a T shape. The first electrode 20a has a lower electrode 42 and an upper electrode 43, and the upper electrode 43 is wider than the lower electrode 42. As described above, a shape in which the upper electrode 43 protrudes relative to the lower electrode 42 toward both sides in the direction (x-axis direction) perpendicular to the stripe direction (y-axis direction) of the first ridge 12 in a plan view is referred to as T shape.

As described above, according to embodiment 2, the first electrode 20a has a T shape, and thus the electric resistance of the first electrode 20a can be reduced, whereby the optical semiconductor element can be operated at high speed. In addition, loss of current is also small.

Figure 7:
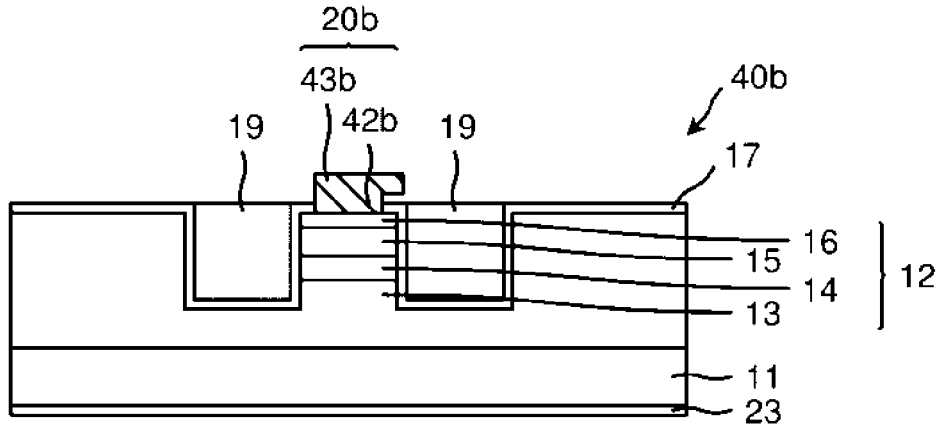
FIG. 7 is a sectional view showing a modification of the optical semiconductor element according to embodiment 2.

The first electrode may have a r shape. The r shape refers to such a shape that, as shown in FIG. 7, an upper electrode 43b protrudes relative to a lower electrode 42b toward only one side in the direction (x-axis direction) perpendicular to the stripe direction (y-axis direction) of the first ridge 12 in a plan view. Also in this case, the electric resistance of a first electrode 20b can be reduced.

Embodiment 3

An optical semiconductor element according to embodiment 3 will be described. The optical semiconductor element according to embodiment 3 is different from embodiment 1 in that a structural portion for preventing one-side contact is formed. Here, difference from embodiment 1 will be mainly described.

FIG. 8A is a top view of an optical semiconductor element 50 according to embodiment 3. FIG. 8B is a sectional view of the optical semiconductor element 50 along line B-B in FIG. 8A.

The optical semiconductor element 50 has insulators 51. Each insulator 51 is formed in a region more distant than the first ridge groove 18 from the first ridge 12 such that the top surface height of the insulator 51 is equal to that of the first electrode 20. Here, the region more distant than the first ridge groove 18 from the first ridge 12 is a region indicated by R1 on the left side of the first ridge 12 or a region indicated by R2 on the right side of the first ridge 12, in FIG. 8A.

Next, an example in which the optical semiconductor element 50 is junction-down mounted on a sub-mount 52 will be described with reference to FIG. 9. FIG. 9 is a sectional view showing a state in which the optical semiconductor element 50 is mounted on the sub-mount 52.

Third sub-mount electrodes 54 are formed on the sub-mount 52. Each third sub-mount electrode 54 has a layer structure such as Ti/Au or Ti/Pt/Au from the lower side. The insulators 51 of the optical semiconductor element 50 are in contact with the third sub-mount electrodes 54.

As described above, according to embodiment 3, since the insulators 51 are provided at the left and the right of the first ridge 12, it is possible to prevent a one-side contact state in which the optical semiconductor element 50 tilts when mounted on the sub-mount 52. That is, the insulators 51 serve as structural portions for preventing one-side contact.

The above description shows a case where the insulators 51 are provided at both of the left and the right of the first ridge 12, but the insulator 51 may be provided at only one side. In addition, as the structural portion, a conductor such as metal may be used. In particular, if the structural portion is formed simultaneously with the first electrode 20, the number of manufacturing steps can be decreased. In such a case of using a conductor, the conductor may be joined to the third sub-mount electrode 54 of the sub-mount 52 at the time of junction-down mounting.

Embodiment 4

An optical semiconductor element according to embodiment 4 will be described. The optical semiconductor element according to embodiment 4 is different from embodiment 3 in that the structural portion for preventing one-side contact is a recess electrode formed in a recess. Here, difference from embodiment 3 will be mainly described.

Figures 10A, 10B:
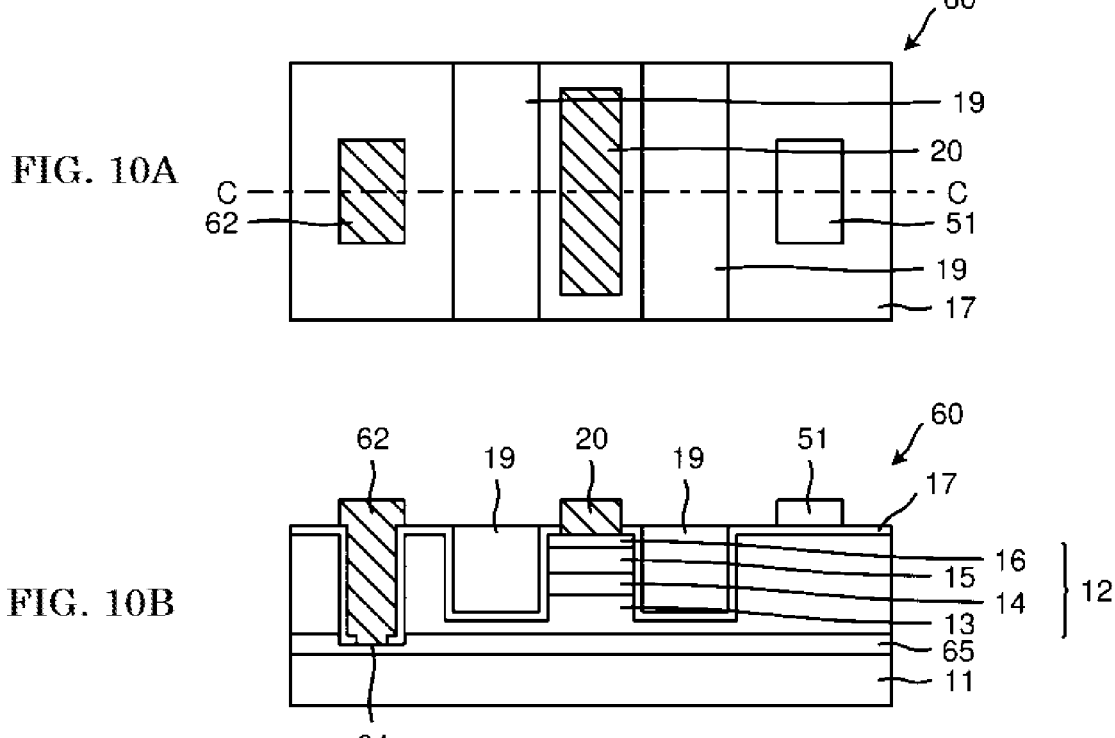
FIG. 10A is a top view of an optical semiconductor element according to embodiment 4.
FIG. 10B is a sectional view of the optical semiconductor element according to embodiment 4 along line C-C in FIG. 10A.

FIG. 10A is a top view of an optical semiconductor element 60 according to embodiment 4 in a plan view. FIG. 10B is a sectional view of the optical semiconductor element 60 along line C-C in FIG. 10A.

The optical semiconductor element 60 has a lower-side contact layer 65 between the substrate 11 and the first ridge 12. The lower-side contact layer 65 is electrically connected to the first first-conductivity-type cladding layer 13. The lower-side contact layer 65 is made of InP which is conductive.

The optical semiconductor element 60 has a recess 61. The location of the recess 61 is shown in FIG. 11B which illustrates a manufacturing method. The recess 61 is formed in a region more distant than the first ridge groove 18 from the first ridge 12 such that a bottom surface 64 of the recess 61 is in contact with the lower-side contact layer 65. The insulating film 17 is formed on the recess 61. The insulating film 17 has an opening at the bottom surface 64 of the recess 61.

The optical semiconductor element 60 has a recess electrode 62. The recess electrode 62 is formed in the recess 61 such that the top surface height thereof is equal to that of the first electrode 20. The recess electrode 62 is electrically connected to the lower-side contact layer 65 at the bottom surface 64 of the recess 61. That is, the recess electrode 62 is electrically connected to the first first-conductivity-type cladding layer 13 via the lower-side contact layer 65. The recess electrode 62 is made of Au, for example, and the topmost part thereof has a layer structure such as Ti/Pt/AuSn (solder)/Au from the lower side, as in the first electrode 20 of embodiment 1. The AuSn layer is a recess solder layer 63 made of solder.

The optical semiconductor element 60 has an insulator 51. The insulator 51 is formed on the side opposite to the recess electrode 62 across the first ridge 12. The insulator 51 is the same as the insulator 51 described in embodiment 3.

Next, a manufacturing method for the optical semiconductor element 60 will be described with reference to sectional views (FIGS. 11A to 12B).

Figure 11A:
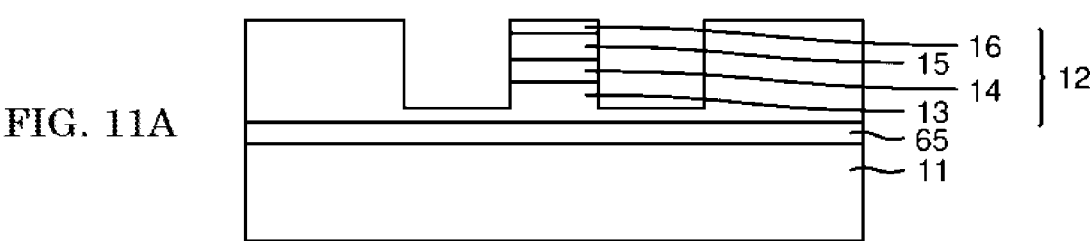
FIG. 11A is a sectional view illustrating a manufacturing method for the optical semiconductor element according to embodiment 4.
Figure 11B:
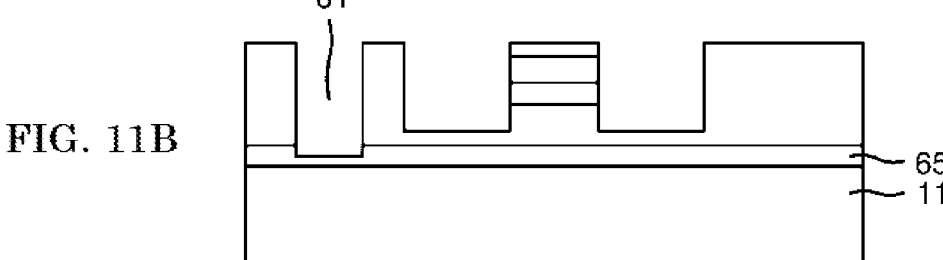
FIG. 11B is a sectional view illustrating the manufacturing method for the optical semiconductor element according to embodiment 4.
Figure 11C:
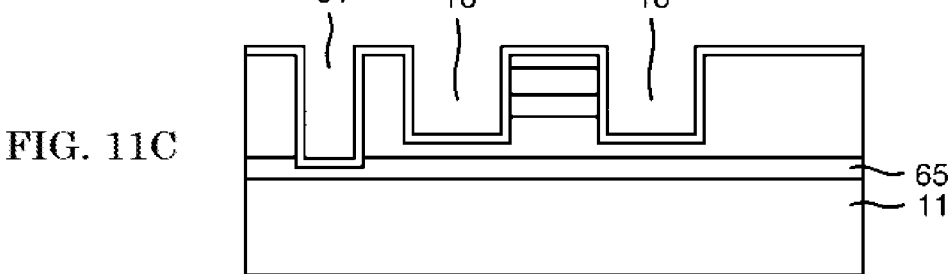
FIG. 11C is a sectional view illustrating the manufacturing method for the optical semiconductor element according to embodiment 4.
Figure 11D:
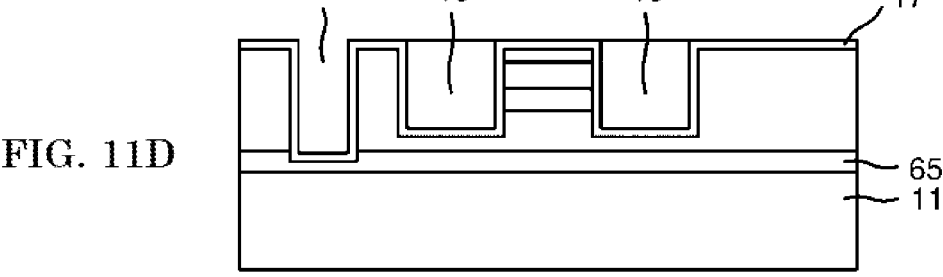
FIG. 11D is a sectional view illustrating the manufacturing method for the optical semiconductor element according to embodiment 4.
Figures 12A, 12B:
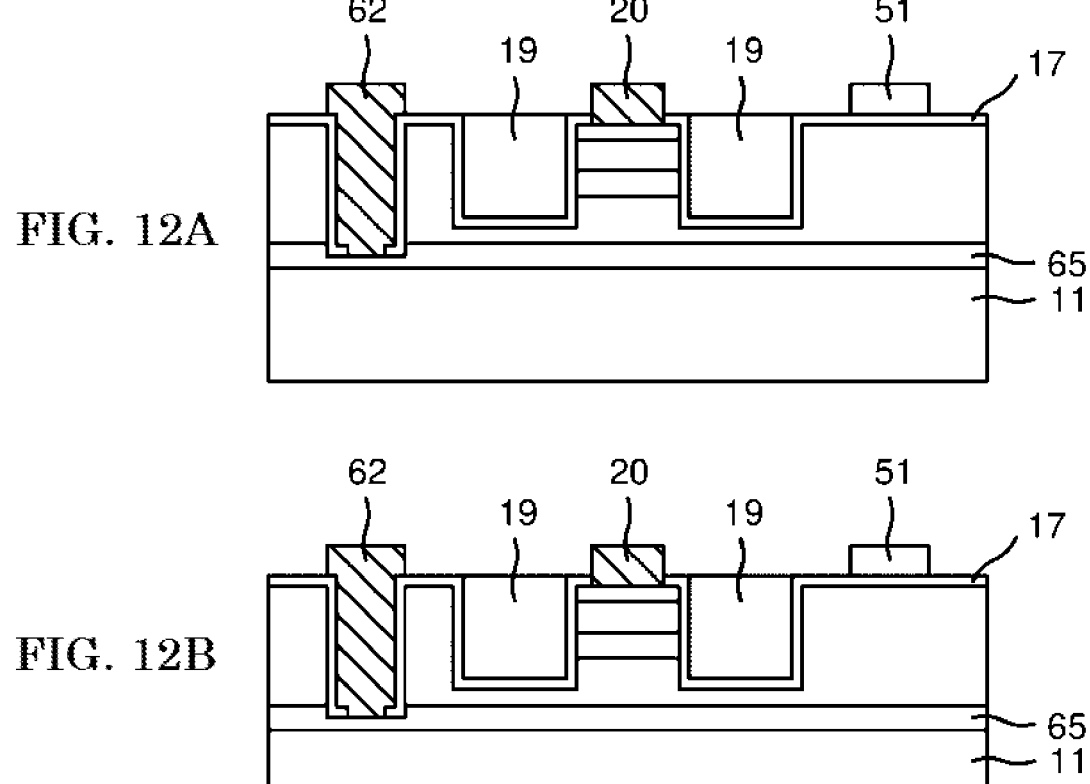
FIG. 12A is a sectional view illustrating the manufacturing method for the optical semiconductor element according to embodiment 4.
FIG. 12B is a sectional view illustrating the manufacturing method for the optical semiconductor element according to embodiment 4.

First, as shown in FIG. 11A, using a known semiconductor process technology on the substrate 11, the substrate 11 having the lower-side contact layer 65 thereon with the first ridge 12 formed on the lower-side contact layer 65 is prepared. Next, as shown in FIG. 11B, the recess 61 is formed by etching. At this time, the bottom of the recess 61 is adjusted to be within the lower-side contact layer 65. Next, as shown in FIG. 11C, the insulating film 17 is formed. Thus, the regions of the first ridge grooves 18 are determined. Next, as shown in FIG. 11D, the resin films 19 are embedded in the first ridge grooves 18. Next, as shown in FIG. 12A, the recess electrode 62, the first electrode 20, and the insulator 51 are formed. At this time, before the first electrode 20 is formed, the insulating film 17 on the first ridge 12 is etched so that the first contact layer 16 is exposed. Next, as shown in FIG. 12B, a lower surface of the substrate 11 is ground so that the substrate 11 becomes a thin plate.

Figure 13:
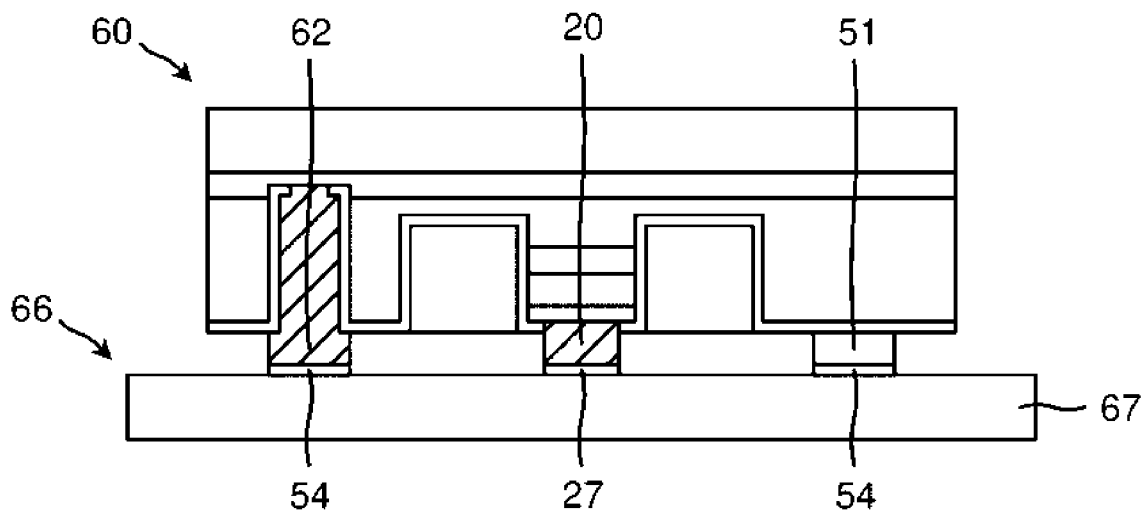
FIG. 13 is a sectional view showing an example in which the optical semiconductor element according to embodiment 4 is junction-down mounted on a sub-mount.

Next, an example in which the optical semiconductor element 60 is junction-down mounted on a sub-mount 66 will be described with reference to FIG. 13. FIG. 13 is a sectional view showing a state in which the optical semiconductor element 60 is mounted on the sub-mount 66.

Third sub-mount electrodes 54 are formed on the sub-mount 66. Joining between the optical semiconductor element 60 and the sub-mount 66 is made by the first electrode 20 and the first sub-mount electrode 27, and the recess electrode 62 and the third sub-mount electrode 54. Here, the first solder layer 21 of the first electrode 20 and the recess solder layer 63 of the recess electrode 62 serve as joining agents.

As described above, according to embodiment 4, the recess electrode 62 electrically connected to the first first-conductivity-type cladding layer 13 protrudes out on the upper side of the optical semiconductor element 60, and therefore, at the time of junction-down mounting the optical semiconductor element 60 on the sub-mount 66, the recess electrode 62 and the third sub-mount electrode 54 can be joined without using a bonding wire. Thus, the mounting can be easily performed and the inductance of wiring can be reduced. In addition, since an electrode for a bonding wire is not needed, the sub-mount 66 can be made small. In addition, since the area of the recess electrode 62 is small, the amount of solder can also be reduced, so that spreading of the solder after junction-down mounting can be suppressed.

It is noted that the insulator 51 may not necessarily be provided. As the structural portion, a conductor such as metal may be used instead of the insulator 51. In particular, if the structural portion is formed simultaneously with the first electrode 20 and the upper part of the recess electrode 62, the number of manufacturing steps can be decreased. In such a case of using a conductor, the conductor may be joined to the third sub-mount electrode 54 at the time of junction-down mounting.

Embodiment 5

Figure 14:
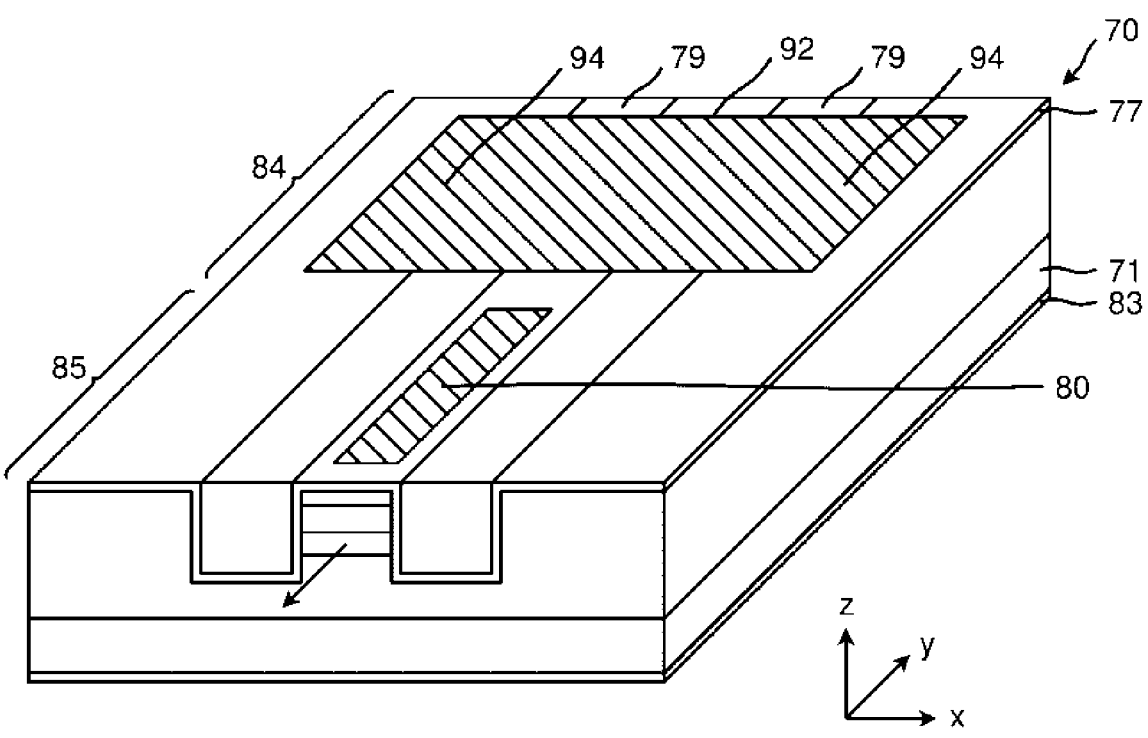
FIG. 14 is a perspective view of an optical semiconductor element according to embodiment 5.
Figure 15A:
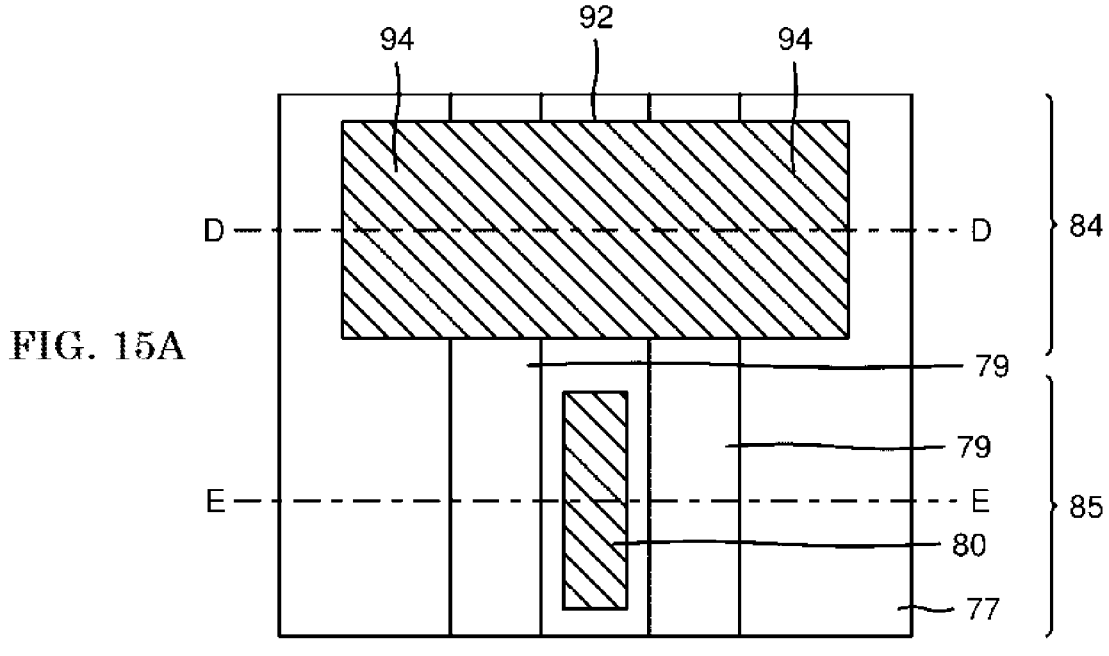
FIG. 15A is a top view of the optical semiconductor element according to embodiment 5.
Figure 15B:
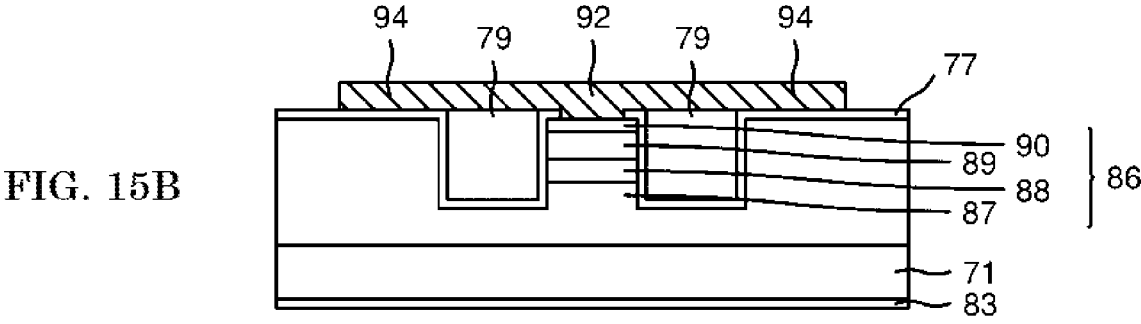
FIG. 15B is a sectional view of the optical semiconductor element according to embodiment 5 along line D-D in FIG. 15A.
Figure 15C:
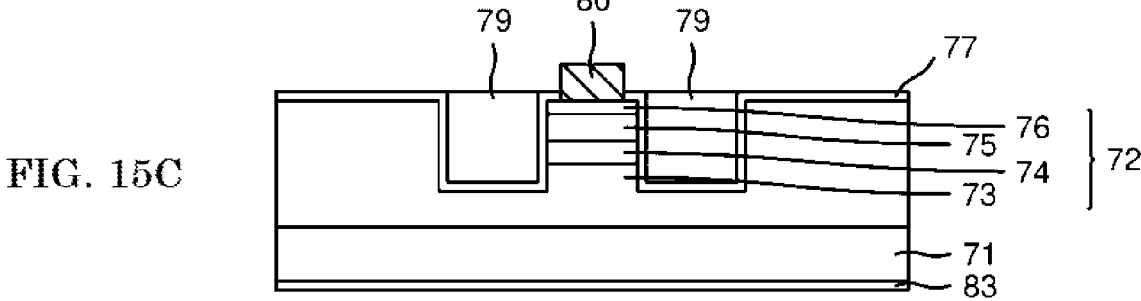
FIG. 15C is a sectional view of the optical semiconductor element according to embodiment 5 along line E-E in FIG. 15A.

The configuration of an optical semiconductor element according to embodiment 5 will be described. FIG. 14 is a perspective view of an optical semiconductor element 70 according to embodiment 5. FIG. 15A is a top view of the optical semiconductor element 70. FIG. 15B is a sectional view of the optical semiconductor element 70 along line D-D in FIG. 15A. FIG. 15C is a sectional view of the optical semiconductor element 70 along line E-E in FIG. 15A. The optical semiconductor element 70 has a laser portion 84 and a modulator portion 85 integrated therein. The modulator portion 85 itself does not emit a laser beam and therefore is different in function from the optical semiconductor element 10 in embodiment 1. However, the structure of the modulator portion 85 corresponds to that of the optical semiconductor element 10 in embodiment 1. The optical semiconductor element 70 is formed with the laser portion 84 added to the above modulator portion 85.

The optical semiconductor element 70 has a substrate 71. The substrate 71 is a semiconductor substrate made of InP, for example.

The laser portion 84 has a second ridge 86 as shown in FIG. 15B. The second ridge 86 is formed on the substrate 71 contiguously to a first ridge 72. A stripe direction of the second ridge 86 is a direction (y-axis direction) perpendicular to the drawing sheet of FIG. 15B. The width of the second ridge 86 is, for example, 1 μm to 30 μm.

The second ridge 86 has a second first-conductivity-type cladding layer 87, a second core layer 88, a second second-conductivity-type cladding layer 89, and a second contact layer 90 in this order from the lower side.

The second first-conductivity-type cladding layer 87 is a semiconductor layer whose conductivity type is a p type or an n type, and is made of InP. The second core layer 88 is an active layer having a quantum well structure and is made of InGaAsP. The second second-conductivity-type cladding layer 89 is a semiconductor layer whose conductivity type is opposite to that of the second first-conductivity-type cladding layer 87, and is made of InP. The second contact layer 90 is made of InGaAs which is conductive. The second core layer 88 emits a laser beam. The laser beam is a continuous-wave (CW) beam.

Second ridge grooves 91 are provided on both lateral sides of the second ridge 86. The width of each second ridge groove 91 is, for example, 2 μm to 20 μm, and the depth thereof is, for example, 2 μm to 10 μm. An insulating film 77 is formed on a surface of the second ridge 86 excluding a part of the top surface thereof, and on side surfaces and bottom surfaces of the second ridge grooves 91. A resin film 79 is embedded in each second ridge groove 91. The resin film 79 is made of benzocyclobutene (BCB), polyimide, or the like.

The laser portion 84 has a second electrode 92. The second electrode 92 is in contact with the second contact layer 90, on the second ridge 86. The second electrode 92 has a spreading portion 94 spreading over the second ridge grooves 91. The second electrode 92 has a layer structure such as Ti/Au/Ti/Pt/AuSn (solder)/Au or Ti/Pt/Au/Ti/Pt/AuSn (solder)/Au from the lower side. Among these layers, the Ti layer and the Pt layer are thin films having a thickness of 1 μm or less. The AuSn layer is a second solder layer 93. The film thickness of the second solder layer 93 is 1 μm to 10 μm. The topmost Au layer is a thin film having a thickness of 1 μm or less. Ti contributes to improvement in electrode adhesion, and Pt serves as barrier metal. As the barrier metal, Ni, Ta, Cr, or the like may be used instead of Pt. The topmost Au layer serves to prevent oxidation of the surface of the second electrode 92.

The modulator portion 85 has the first ridge 72 as shown in FIG. 15C. The first ridge 72 is formed on the substrate 71. A stripe direction of the first ridge 72 is a direction (y-axis direction) perpendicular to the drawing sheet of FIG. 15C. The width of the first ridge 72 is, for example, 1 μm to 30 μm.

The first ridge 72 has a first first-conductivity-type cladding layer 73, a first core layer 74, a first second-conductivity-type cladding layer 75, and a first contact layer 76 in this order from the lower side.

The first first-conductivity-type cladding layer 73 is a semiconductor layer whose conductivity type is a p type or an n type, and is made of InP. The first core layer 74 is an absorption layer having a quantum well structure and is made of AlGaInAs. The first second-conductivity-type cladding layer 75 is a semiconductor layer whose conductivity type is opposite to that of the first first-conductivity-type cladding layer 73, and is made of InP. The first contact layer 76 is made of InGaAs which is conductive. The first core layer 74 modulates a laser beam from the second core layer 88 of the laser portion 84. The modulation is performed by voltages applied to the first first-conductivity-type cladding layer 73 and the first second-conductivity-type cladding layer 75. The modulated laser beam is emitted from an end surface as shown by an arrow in FIG. 14.

First ridge grooves 78 are provided on both lateral sides of the first ridge 72. The width of each first ridge groove 78 is, for example, 2 μm to 20 μm, and the depth thereof is, for example, 2 μm to 10 μm. The insulating film 77 is formed on a surface of the first ridge 72 excluding a part of the top surface thereof, and on side surfaces and bottom surfaces of the first ridge grooves 78. A resin film 79 is embedded in each first ridge groove 78. The resin film 79 is made of benzocyclobutene (BCB), polyimide, or the like.

The modulator portion 85 has a first electrode 80. The first electrode 80 is in contact with the first contact layer 76, on the first ridge 72. The first electrode 80 is formed on only an upper part of the first ridge 72 without spreading to the first ridge grooves 78. The first electrode 80 has a layer structure such as Ti/Au/Ti/Pt/AuSn (solder)/Au or Ti/Pt/Au/Ti/Pt/AuSn (solder)/Au from the lower side. Among these layers, the Ti layer and the Pt layer are thin films having a thickness of 1 μm or less. The AuSn layer is a first solder layer 81. The film thickness of the first solder layer 81 is 1 μm to 10 μm. The topmost Au layer is a thin film having a thickness of 1 μm or less. Ti contributes to improvement in electrode adhesion, and Pt serves as barrier metal. As the barrier metal, Ni, Ta, Cr, or the like may be used instead of Pt. The topmost Au layer serves to prevent oxidation of the surface of the first electrode 80.

The optical semiconductor element 70 has a back-surface electrode 83 at a lower surface of the substrate. The back-surface electrode 83 is electrically connected to the first first-conductivity-type cladding layer 73 and the second first-conductivity-type cladding layer 87 via the substrate 71.

The longitudinal-direction (y-axis direction) length of the laser portion 84 is, for example, 200 μm to 400 μm, and the longitudinal-direction length of the modulator portion 85 is, for example, 100 μm to 300 μm.

Next, a manufacturing method for the optical semiconductor element 70 will be described with reference to sectional views (FIGS. 16A to 16E). In FIGS. 16A to 16E, the left side shows the laser portion 84 and the right side shows the modulator portion 85.

Figures 16A, 16B, 16C, 16D, 16E:
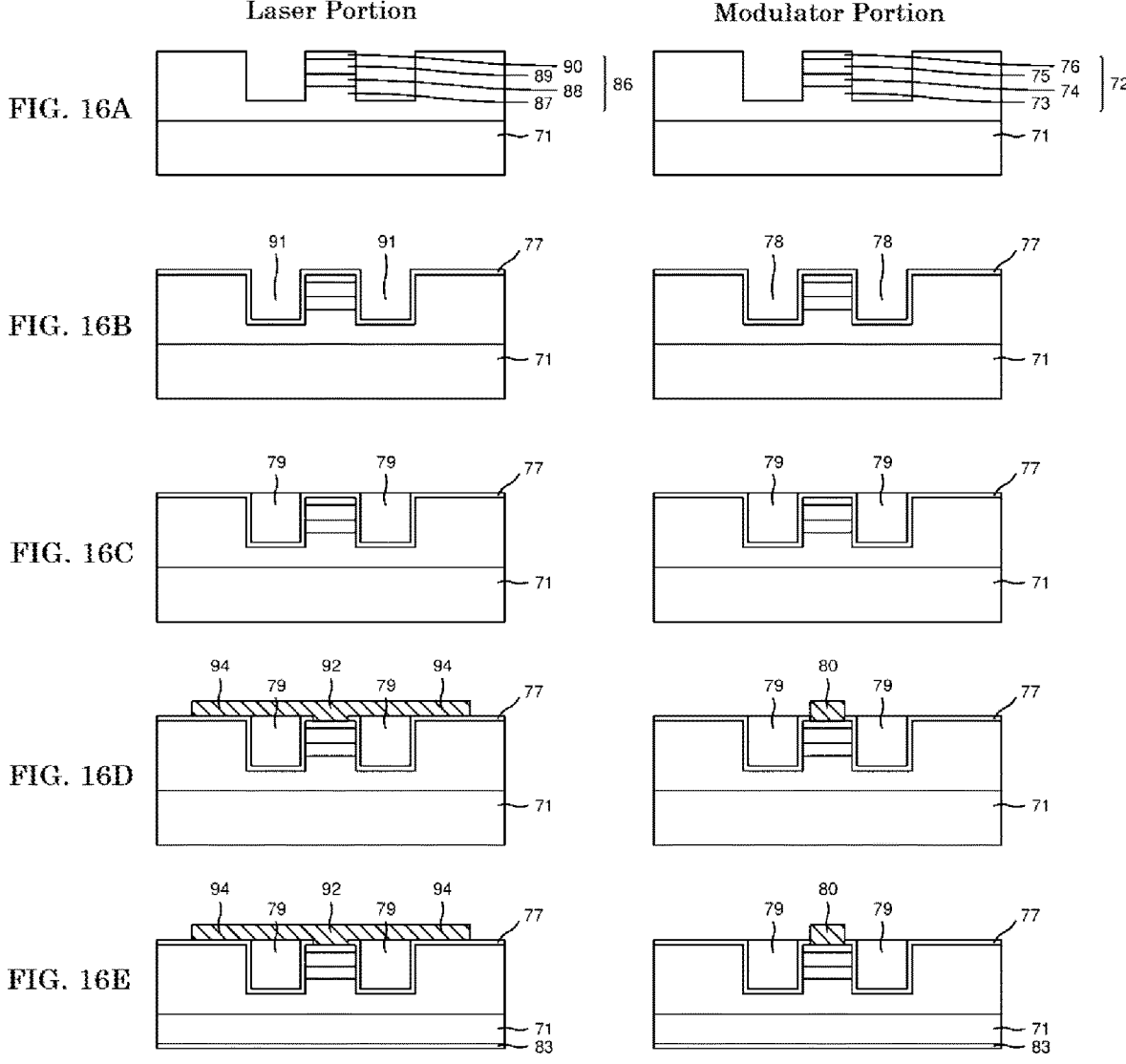
FIG. 16A is a sectional view illustrating a manufacturing method for the optical semiconductor element according to embodiment 5.
FIG. 16B is a sectional view illustrating the manufacturing method for the optical semiconductor element according to embodiment 5.
FIG. 16C is a sectional view illustrating the manufacturing method for the optical semiconductor element according to embodiment 5.
FIG. 16D is a sectional view illustrating the manufacturing method for the optical semiconductor element according to embodiment 5.
FIG. 16E is a sectional view illustrating the manufacturing method for the optical semiconductor element according to embodiment 5.

First, as shown in FIG. 16A, the substrate 71 on which the first ridge 72 and the second ridge 86 have been formed using a known semiconductor process technology is prepared. Next, as shown in FIG. 16B, the insulating film 77 is formed. Thus, the regions of the first ridge grooves 78 and the second ridge grooves 91 are determined. Next, as shown in FIG. 16C, the resin films 79 are embedded in the first ridge grooves 78 and the second ridge 86. Next, as shown in FIG. 16D, the insulating film 77 on the first ridge 72 and the second ridge groove 91 is etched so that the first contact layer 76 and the second contact layer 90 are exposed. Then, the first electrode 80 is formed in contact with the first contact layer 76, and at the same time, the second electrode 92 is formed in contact with the second contact layer 90. Next, as shown in FIG. 16E, a lower surface of the substrate 71 is ground so that the substrate 71 becomes a thin plate, and then the back-surface electrode 83 is formed.

Next, an example in which the optical semiconductor element 70 is junction-down mounted on a sub-mount 95 will be described with reference to FIGS. 17A and 17B. FIGS. 17A and 17B are sectional views showing a state in which the optical semiconductor element 70 is mounted on the sub-mount 95. FIG. 17A is a sectional view at the laser portion 84, and FIG. 17B is a sectional view at the modulator portion 85. In both of FIG. 17A and FIG. 17B, bonding wires and wire-bonding electrodes 99 are shown, but this is for convenience sake in description. In actuality, it suffices that one bonding wire and one wire-bonding electrode 99 are provided for each portion and the locations thereof may be set as appropriate. The numbers of bonding wires and wire-bonding electrodes 99 for each portion may be two or more.

The sub-mount 95 has a sub-mount substrate 96, and a first sub-mount electrode 97, a second sub-mount electrode 98, and the wire-bonding electrodes 99 are formed on the sub-mount substrate 96. The first sub-mount electrode 97, the second sub-mount electrode 98, and the wire-bonding electrodes 99 have a layer structure such as Ti/Au or Ti/Pt/Au from the lower side. Since a solder layer is not formed at the first sub-mount electrode 97, it is possible to make a fine pattern of the first sub-mount electrode 97.

The optical semiconductor element 70 is joined to the sub-mount 95. The joining is made by the first electrode 80 and the first sub-mount electrode 97, and the second electrode 92 and the second sub-mount electrode 98. The first solder layer 81 of the first electrode 80 and the second solder layer 93 of the second electrode 92 serve as joining agents.

The back-surface electrode 83 and the wire-bonding electrodes 99 are wire-bonded to each other.

As described above, according to embodiment 5, the same effects as those described in embodiment 1 are obtained.

In addition, since the second electrode 92 has the spreading portion 94, the electric resistance is small, and therefore loss of current flowing for causing the laser portion 84 to emit a laser beam is small.

The spreading portion 94 may be formed on only one side of the second ridge 86 instead of being formed on both the left and right sides thereof. In addition, the recess electrode described in embodiment 4 may be formed in the region of the modulator portion 85. In this case, since the first first-conductivity-type cladding layer 73 and the recess electrode of the modulator portion 85 are electrically connected to each other, the back-surface electrode 83 need not be provided.

Embodiment 6

An optical semiconductor element according to embodiment 6 will be described. The optical semiconductor element according to embodiment 6 is different from embodiment 5 in that a spreading portion extends to a modulator portion and this extending portion serves as a structural portion. Here, difference from embodiment 5 will be mainly described.

FIG. 18 is a top view of an optical semiconductor element 100 according to embodiment 6.

In the optical semiconductor element 100, spreading portions 107 of a second electrode 104 extend to a modulator portion 103. These extending portions serve as the structural portions described in embodiment 3.

Figure 19:
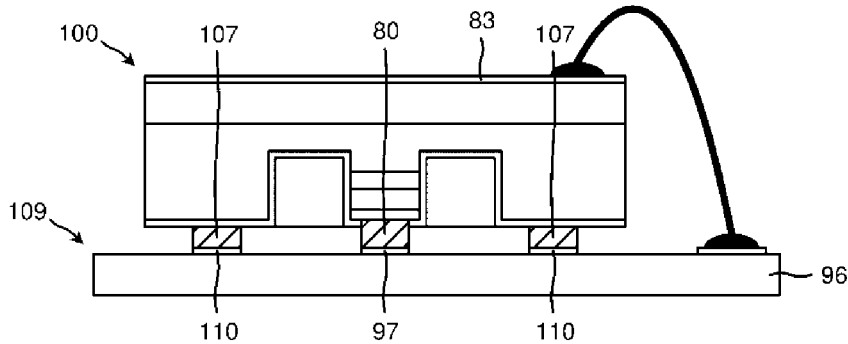
FIG. 19 is a sectional view showing an example in which the optical semiconductor element according to embodiment 6 is junction-down mounted on a sub-mount.

Next, an example in which the optical semiconductor element 100 is junction-down mounted on a sub-mount 109 will be described with reference to FIG. 19. FIG. 19 is a sectional view showing a state in which the optical semiconductor element 100 is mounted on the sub-mount 109. The cross-section location is at line F-F in FIG. 18.

A second sub-mount electrode 110 on the sub-mount 109 is formed so as to match the shape of the second electrode 104 of the optical semiconductor element 100. The second sub-mount electrode 110 and the second electrode 104 are joined to each other.

As described above, according to embodiment 6, since spreading portions 107 extend to the left and right sides of the first ridge 72, it is possible to prevent a one-side contact state in which the optical semiconductor element 100 tilts when mounted on the sub-mount 109. That is, the spreading portions 107 extending to the modulator portion 103 serve as structural portions for preventing one-side contact.

In the above description, the spreading portions 107 extending to the modulator portion 103 are present on both the left and right sides of the first ridge 72. However, the spreading portion 107 may be present on only one side.

Figure 20:
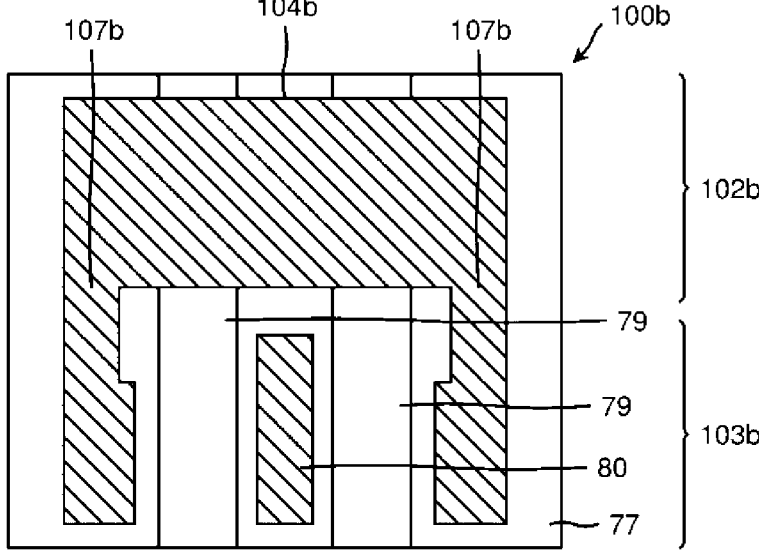
FIG. 20 is a top view showing a modification of the optical semiconductor element according to embodiment 6.

The spreading portions 107 extending to the modulator portion 103 may have a key shape as shown in FIG. 20. The key shape refers to a shape in which the spreading portion 107 extending to the modulator portion 103 side is thickened from an intermediate part. This can more stably prevent one-side contact of the optical semiconductor element 100.

Although the spreading portions 107 extending to the modulator portion 103 are used as the structural portions for preventing one-side contact, the insulator (or electrode) described in embodiment 3 or the recess electrode described in embodiment 4 may be used. In a case of using the recess electrode, the back-surface electrode 83 need not be provided.

Embodiment 7

An optical semiconductor element according to embodiment 7 will be described. The optical semiconductor element according to embodiment 7 is different from embodiment 5 in that resin films are not formed in ridge grooves. Here, the difference will be mainly described.

Figure 21:
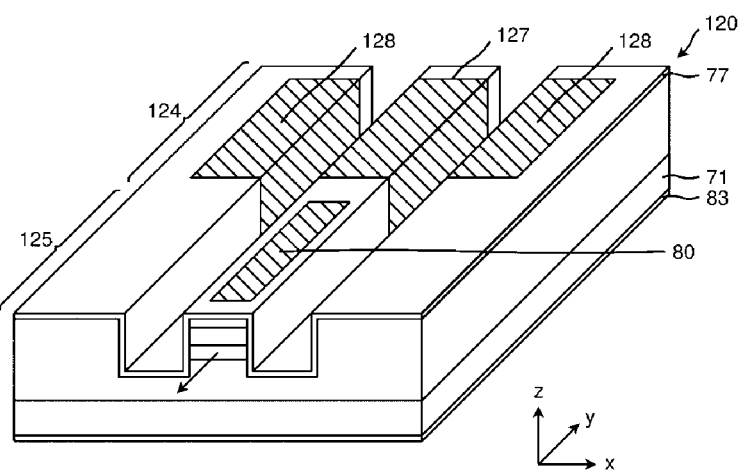
FIG. 21 is a perspective view of an optical semiconductor element according to embodiment 7.
Figure 22A:
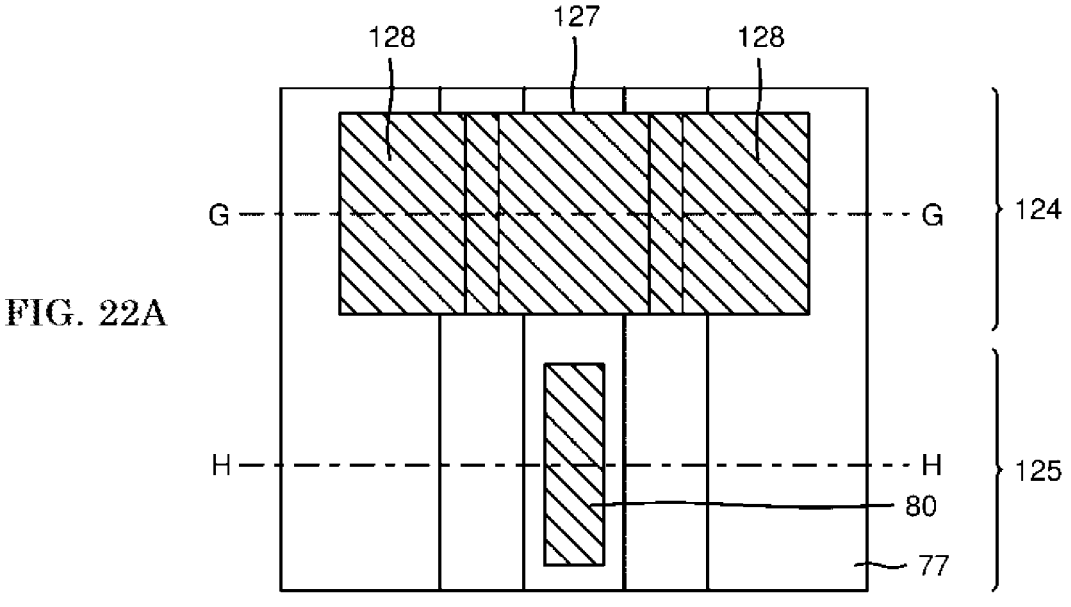
FIG. 22A is a top view of the optical semiconductor element according to embodiment 7.
Figure 22B:
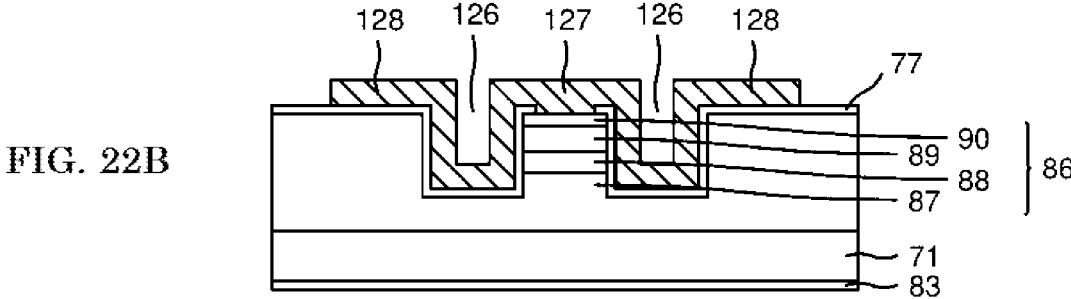
FIG. 22B is a sectional view of the optical semiconductor element according to embodiment 7 along line G-G in FIG. 22A.
Figure 22C:
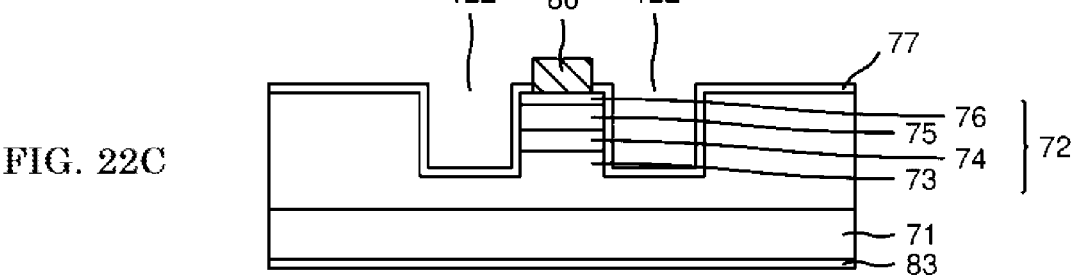
FIG. 22C is a sectional view of the optical semiconductor element according to embodiment 7 along line H-H in FIG. 22A.

FIG. 21 is a perspective view of an optical semiconductor element 120 according to embodiment 7. FIG. 22A is a top view of the optical semiconductor element 120, FIG. 22B is a sectional view along line G-G in FIG. 22A, and FIG. 22C is a sectional view along line H-H in FIG. 22A. Here, the optical semiconductor element 120 has a laser portion 124 and a modulator portion 125 integrated therein, as in the optical semiconductor element 70 of embodiment 5. As shown in the drawings, resin films are not formed in first ridge grooves 122 and second ridge grooves 126. In particular, the insides of the first ridge grooves 122 are hollow. A second electrode 127 is formed from the area on the second ridge 86 also at the insides of the second ridge grooves 126 and extends to spreading portions 128.

As described above, according to embodiment 7, since resin films are not formed in the first ridge grooves 122 and the second ridge grooves 126, a manufacturing process for embedding resin films can be omitted. In addition, as compared to a case of embedding resin films, permittivity can be reduced, and thus the parasitic capacitance of the first electrode 80 can be reduced.

While the insides of the first ridge grooves 122 are hollow, resin films may be embedded in the second ridge grooves 126. Also in this case, the parasitic capacitances of the first ridge grooves 122 can be reduced. Instead of integrating the laser portion 124 and the modulator portion 125, a configuration not having the modulator portion 125 may be employed as in embodiment 1 or the like.

It is noted that combining, modifying, and simplifying the above embodiments as appropriate are also included in the scope of the technical ideas shown in the embodiments.

DESCRIPTION OF THE REFERENCE
CHARACTERS

10, 40, 50, 60, 70, 100, 120 optical semiconductor element
11, 71 substrate
12, 72 first ridge
13, 73 first first-conductivity-type cladding layer
14, 74 first core layer
15, 75 first second-conductivity-type cladding layer
16, 76 first contact layer
18, 78, 122 first ridge groove
20, 20*a*, 20, 80, 20*b* first electrode
21, 81 first solder layer
42, 42*b* lower electrode
43, 43*b* upper electrode
61 recess
62 recess electrode
63 recess solder layer
64 bottom surface
65 lower-side contact layer
86 second ridge
87 second first-conductivity-type cladding layer
88 second core layer
89 second second-conductivity-type cladding layer
90 second contact layer
91, 126 second ridge groove
92, 104, 127, 104*b* second electrode
93, 106 second solder layer
94, 107, 128, 107*b* spreading portion

The invention claimed is:

1. An optical semiconductor element comprising:
a substrate;
a first ridge formed on the substrate and having a first first-conductivity-type cladding layer, a first core layer, a first second-conductivity-type cladding layer, and a first contact layer in this order from a lower side, with first ridge grooves provided on both lateral sides of the first ridge;
a first electrode formed on the first ridge without spreading to, or being electrically connected by way of, the first ridge grooves, the first electrode including a first solder layer, wherein the first electrode is formed in contact with the first contact layer;
a second ridge formed on the substrate and contiguous to the first ridge, the second ridge having a second first-conductivity-type cladding layer, a second core layer, a second second-conductivity-type cladding layer, and a second contact layer in this order from a lower side, with second ridge grooves provided on both lateral sides of the second ridge; and
a second electrode formed in contact with the second contact layer, on the second ridge, and having a spreading portion spreading over the second ridge grooves, the second electrode including a second solder layer, wherein
the second core layer is an active layer that emits a laser beam, and
the first core layer is an absorption layer that modulates the laser beam from the second core layer.

2. The optical semiconductor element according to claim 1, wherein
the second solder layer is made of AuSn, and
a layer made of Au is formed on the second solder layer.

3. The optical semiconductor element according to claim 2, wherein
a structural portion whose top surface height is equal to that of the first electrode is formed in a region more distant than the first ridge grooves from the first ridge.

4. The optical semiconductor element according to claim 3, wherein
a lower-side contact layer electrically connected to the first first-conductivity-type cladding layer is formed between the substrate and the first ridge,
a recess is formed in a region more distant than the first ridge grooves from the first ridge such that a bottom surface of the recess is in contact with the lower-side contact layer,
a recess electrode whose top surface height is equal to that of the first electrode is formed in the recess such that the recess electrode is electrically connected to the first first-conductivity-type cladding layer via the bottom surface, the recess electrode including a recess solder layer, and
the structural portion is the recess electrode.

5. The optical semiconductor element according to claim 4, wherein
the recess solder layer is made of AuSn, and
a layer made of Au is formed on the recess solder layer.

6. The optical semiconductor element according to claim 2, wherein
a structural portion whose top surface height is equal to that of the first electrode is formed in a region more distant than the first ridge grooves from the first ridge, and
the structural portion is a portion formed by the spreading portion extending.

7. The optical semiconductor element according to claim 2, wherein
insides of the first ridge grooves are hollow.

8. The optical semiconductor element according to claim 1, wherein
a structural portion whose top surface height is equal to that of the first electrode is formed in a region more distant than the first ridge grooves from the first ridge.

9. The optical semiconductor element according to claim 8, wherein
a lower-side contact layer electrically connected to the first first-conductivity-type cladding layer is formed between the substrate and the first ridge,
a recess is formed in a region more distant than the first ridge grooves from the first ridge such that a bottom surface of the recess is in contact with the lower-side contact layer,

a recess electrode whose top surface height is equal to that of the first electrode is formed in the recess such that the recess electrode is electrically connected to the first first-conductivity-type cladding layer via the bottom surface, the recess electrode including a recess solder layer, and the structural portion is the recess electrode.

10. The optical semiconductor element according to claim 9, wherein the recess solder layer is made of AuSn, and a layer made of Au is formed on the recess solder layer.

11. The optical semiconductor element according to claim 1, wherein a structural portion whose top surface height is equal to that of the first electrode is formed in a region more distant than the first ridge grooves from the first ridge, and the structural portion is a portion formed by the spreading portion extending.

12. The optical semiconductor element according to claim 1, wherein insides of the first ridge grooves are hollow.

13. The optical semiconductor element according to claim 1, wherein the first solder layer does not spread to the first ridge grooves.

14. The optical semiconductor element according to claim 1, wherein all conductive material directly electrically connected to the first contact layer is positioned entirely between the first ridge grooves without extending past innermost sides of the first ridge grooves in a lateral direction in plan view.

15. The optical semiconductor element according to claim 1, wherein the first solder layer does not spread to the first ridge grooves, and the second solder layer spreads to at least one of the second ridge grooves.

* * * * *